(12) United States Patent
Kim et al.

(10) Patent No.: US 7,057,212 B2
(45) Date of Patent: Jun. 6, 2006

(54) FLIP CHIP NITRIDE SEMICONDUCTOR LIGHT EMITTING DIODE

(75) Inventors: Hyun Kyung Kim, Kyungki-do (KR); Young June Jeong, Kyungki-do (KR); Yong Chun Kim, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/867,755

(22) Filed: Jun. 16, 2004

(65) Prior Publication Data

US 2005/0156185 A1    Jul. 21, 2005

(30) Foreign Application Priority Data

Jan. 19, 2004    (KR)    .................... 10-2004-0003960

(51) Int. Cl.
*H01L 29/22*    (2006.01)
*H01L 21/00*    (2006.01)

(52) U.S. Cl. .................... 257/98; 257/99; 257/918; 438/26; 438/29

(58) Field of Classification Search .................... 257/13, 257/918, 79–103; 438/22, 24, 25, 28, 29, 438/46, 47; 372/50; 313/503, 504
See application file for complete search history.

(56) References Cited

U.S. PATENT DOCUMENTS 5,917,202 A    6/1999    Haitz et al.
6,291,839 B1 *    9/2001    Lester .................... 257/91
6,445,007 B1 *    9/2002    Wu et al. .................... 257/80
6,465,808 B1 *    10/2002    Lin .................... 257/81
6,936,859 B1    8/2005    Uemura et al.
2003/0010993 A1 *    1/2003    Nakamura et al. .................... 257/99
2005/0029525 A1 *    2/2005    Wu .................... 257/79

FOREIGN PATENT DOCUMENTS

DE    196 48 309    7/1997
DE    199 21 987    11/1999
DE    102 05 558    8/2003
EP    1 168 460    1/2002
JP    2000-200926    7/2000

* cited by examiner

*Primary Examiner*—David Nelms
*Assistant Examiner*—Long Tran
(74) *Attorney, Agent, or Firm*—Lowe Hauptman & Berner, LLP

(57)    ABSTRACT

In a nitride semiconductor LED, an n-doped nitride semiconductor layer is formed on a transparent substrate. An active layer is formed on the n-doped nitride semiconductor layer. A p-doped nitride semiconductor layer is formed on the active layer. A high reflectivity Ohmic contact layer of a mesh structure is formed on the p-doped nitride semiconductor layer and has a number of open areas for exposing the p-doped nitride semiconductor layer. A metal barrier layer is formed on at least a top region of the high reflectivity Ohmic contact layer. A p-bonding electrode is formed on the metal barrier layer. An n-electrode is formed on the n-doped nitride semiconductor layer.

20 Claims, 5 Drawing Sheets

FLIP CHIP NITRIDE SEMICONDUCTOR LIGHT EMITTING DIODE

This application claims the benefit of Korean Patent Application No. 2004-3960 filed on Jan. 19, 2004, in the Korean Intellectual Property Office, the disclosure of which is incorporated herein by reference.

BACKGROUND OF THE INVENTION

1. Field of the Invention

The present invention relates to a nitride semiconductor Light Emitting Diode (LED), and more particularly, to a flip chip nitride semiconductor LED of excellent electric characteristics and luminance.

2. Description of the Related Art

Recently, a nitride semiconductor LED as an optical device for generating blue or green wavelength light is made from semiconductor material expressed by an equation of $Al_xIn_yGa_{(1-x-y)}N$ (wherein $0 \leq x \leq 1$, $0 \leq y \leq 1$ and $0 \leq x+y \leq 1$). Considering lattice match, nitride semiconductor crystals are grown on a substrate such as a sapphire substrate that is used for the growth of nitride single crystals. Since the sapphire substrate is electrically insulated, p- and n-electrodes are formed on the same side of a final nitride semiconductor LED.

According to structural characteristics as above, nitride semiconductor LEDs have been positively developed into specific geometries adequate to flip chip structures. FIG. 1 illustrates a flip chip light emitting device having a conventional nitride semiconductor LED mounted thereon.

A flip chip light emitting device 20 shown in FIG. 1 includes a nitride semiconductor LED 10 mounted on a supporting substrate 21. The nitride semiconductor LED 10 includes a sapphire substrate 11 and an n-doped nitride semiconductor layer 12, an active layer 13 and a p-doped nitride semiconductor layer 14 formed in their order on the sapphire substrate 11. The nitride semiconductor LED 10 may be mounted on the supporting substrate 21 by welding electrodes 19a and 19b with lead patterns 22a and 22b via conductive bumps 24a and 24b, respectively. In the flip chip light emitting device 20 of this structure, the sapphire substrate 11 of the LED 10 may be used as a light emitting plane since it is transparent.

Each electrode, in particular, the p-electrode of the flip chip nitride semiconductor LED is required to have high reflectivity for reflecting emission light from the active layer 13 toward the light emitting plane while forming an Ohmic contact with the p-doped nitride semiconductor layer 14 as shown in FIG. 1. Therefore, as shown in FIG. 1, a p-electrode structure may include a high reflectivity Ohmic contact layer 15 formed on the p-doped nitride semiconductor layer 14 and a metal barrier layer 16 for preventing the diffusion of components of the Ohmic contact layer 15.

However, since the nitride semiconductor LED 10 shown in FIG. 1 has a planar electrode structure, and in particular, the p-electrode side Ohmic contact layer 15 has a lower specific resistance (for example 5 to 10 mΩ/cm$^2$) lower than that of the p-doped nitride semiconductor layer 14, the nitride semiconductor LED 10 of this type has current crowding in which a major portion of current flowing along the Ohmic contact layer 15 is concentrated in a narrow part A adjacent to the n-electrode as indicated with an arrow.

Such current crowding increases forward voltage while lowering the luminous efficiency of an active layer portion relatively remote from the n-electrode to degrade luminance properties. Further, the current concentrated part A generates a large quantity of heat thereby remarkably degrading the reliability of the LED.

SUMMARY OF THE INVENTION

The present invention has been made to solve the foregoing problems of the prior art and it is therefore an object of the present invention to provide a nitride semiconductor LED having an improved p-electrode structure capable of reducing current crowding in order to realize lower forward voltage as well as higher luminous efficiency.

According to an aspect of the invention for realizing the object, there is provided a nitride semiconductor light emitting diode comprising: a transparent substrate for the single crystal growth of nitride; an n-doped nitride semiconductor layer formed on the transparent substrate; an active layer formed on the n-doped nitride semiconductor layer; a p-doped nitride semiconductor layer formed on the active layer; a high reflectivity Ohmic contact layer of a mesh structure formed on the p-doped nitride semiconductor layer and having a number of open areas for exposing the p-doped nitride semiconductor layer; a metal barrier layer formed on at least a top region of the high reflectivity Ohmic contact layer; a p-bonding electrode formed on the metal barrier layer; and an n-electrode formed on the n-doped nitride semiconductor layer.

The open areas of the high reflectivity Ohmic contact layer may total up to preferably 70% or less, and more preferably, 50% or less of the entire top area of the Ohmic contact layer. Further, the high reflectivity Ohmic contact layer preferably has a reflectivity of at least 70%.

Preferably, the high reflectivity Ohmic contact layer may be made of a material selected from a group including Ag, Ni, Al, Ph, Pd, Ir, Ru, Mg, Zn, Pt, Au and combinations thereof.

In more detail, the high reflectivity Ohmic contact layer may comprise a first layer made of a material selected from a group including Ni, Pd, Ir, Pt and Zn and a second layer of Ag or Al formed on the first layer. Alternatively, the high reflectivity Ohmic contact layer may comprise a first layer made of Ni, a second layer of Ag formed on the first layer and a third layer of Pt formed on the second layer.

In an embodiment of the high reflectivity Ohmic contact layer of two or three layered structure, it is preferred that the first layer has a thickness ranging from about 5 to 50 Å, the second layer has a thickness ranging from about 1000 to 10000 Å, and the third layer has a thickness ranging from about 100 to 500 Å.

According to another embodiment of the invention, the metal barrier layer may be formed to surround the entire high Ohmic contact layer. Also, the metal barrier layer may be formed to be connected with top regions of the p-doped nitride semiconductor layer exposed by the open areas of the high reflectivity Ohmic contact layer in order to function as another reflection layer in the open areas of the high reflectivity Ohmic contact layer.

According to further another embodiment of the invention, the nitride semiconductor light emitting diode may further comprise a dielectric barrier layer formed on the high reflectivity Ohmic contact layer to expose at least the p-bonding electrode.

The dielectric barrier layer may be formed to surround the high reflectivity Ohmic contact layer, and on one side of the light emitting diode to expose the p-bonding electrode and the n-electrode as a conventional passivation layer. In particular, the dielectric barrier layer of the invention may comprise a reflection layer having two types of dielectric layers of different refractivity, the two types of dielectric layers repeatedly alternating with each other, in order to function as a high reflectivity dielectric mirror layer. Preferably, the dielectric barrier layer may be made of oxide or nitride that contains an element selected from a group including Si, Zr, Ta, Ti, In, Sn, Mg and Al.

The terminology used herein "flip chip nitride semiconductor Light Emitting Diode (LED)" indicates an LED used in a flip chip light emitting device in which a side of the LED having p- and n-electrodes is mounted on a substrate of the light emitting device.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
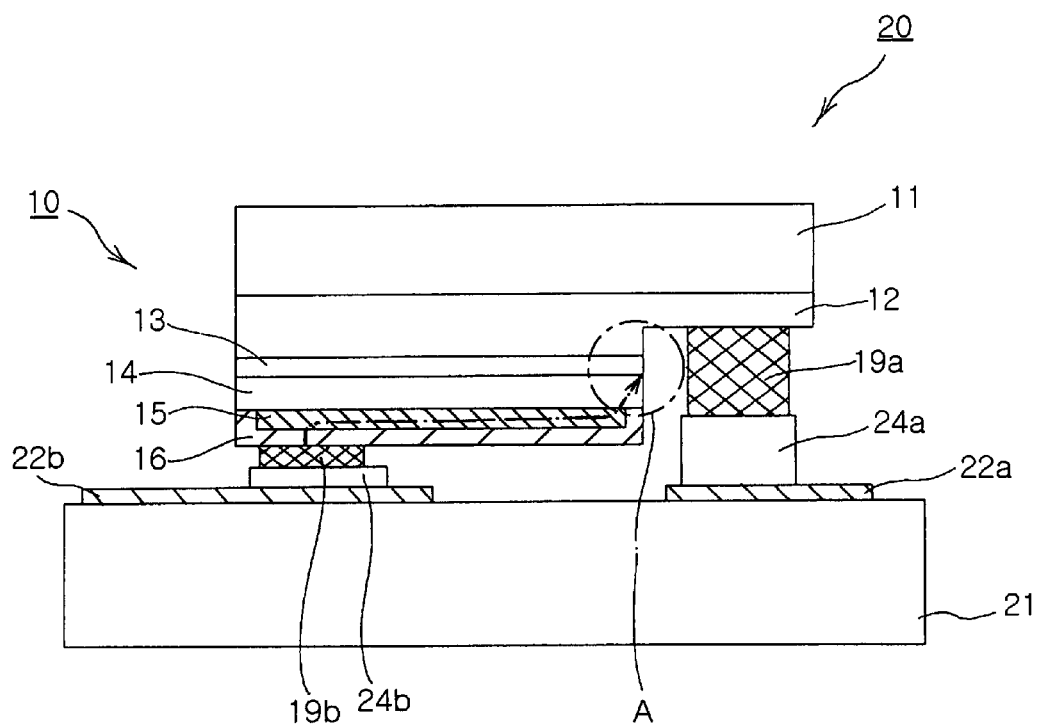
FIG. 1 is a side sectional view illustrating a light emitting device having a conventional nitride semiconductor LED mounted thereon.

Hereinafter components of a nitride semiconductor LED of the invention will be described in more detail.

P- and N-Doped Nitride Semiconductor Layers

P- and n-doped nitride semiconductor layers which are single crystals expressed by an equation of $Al_xIn_yGa_{(1-x-y)}N$ (wherein $0 \leq x \leq 1$, $0 \leq y \leq 1$ and $0 \leq x+y \leq 1$) can be grown via the Metal Organic Chemical Vapor Deposition (MOCVD), the Molecular Beam Epitaxy (MBE), the Hydride Vapor Phase Epitaxy (HVPE) and so on. Representative examples of the nitride semiconductor layer may include GaN, AlGaN or GaInN.

A p-doped semiconductor layer may contain dopants such as Mg, Zn and Be, and an n-doped semiconductor layer may contain dopants such as Si, Ge, Se, Te and C. In general, a buffer layer may be formed between the n-doped nitride semiconductor layer and a substrate. Typical examples of the buffer layer may include a low temperature nucleation layer of for example AlN or GaN.

Active Layer

The active layer of the invention is adopted to emit blue-green light (ranging from about 350 to 550 nm wavelength), and made of an undoped nitride semiconductor layer having a single or multiple quantum well structure. Similar to the p- or n-doped nitride semiconductor layer, the active layer may be grown via any of the MOCVD, the MBE, the HVPE and so on.

High Reflectivity Ohmic Contact Layer

As described hereinbefore, the high reflectivity Ohmic contact layer of the invention is constituted of a mesh structure having a number of open areas. The mesh structure of the high reflectivity Ohmic contact layer relatively lengthens the current path from a p-bonding electrode along the Ohmic contact layer toward an n-electrode. As a result, this alleviates current crowding in a specific region of an LED adjacent to the n-electrode when the LED is energized. This also increases the ability of current to flow toward the p-dope nitride semiconductor layer thereby to relieve the problem of current crowding.

Further, the high reflectivity Ohmic contact layer is necessarily made of a suitable material to lower the contact resistance between itself and the p-doped nitride semiconductor layer of a relatively high energy band gap, and preferably, a high reflectivity material in consideration of a structural aspect of the flip chip nitride semiconductor LED.

The high reflectivity Ohmic contact layer may be made of a material selected from the group consisting of Ag, Ni, Al, Ph, Pd, Ir, Ru, Mg, Zn, Pt, Au and combinations thereof, and preferably has a reflectivity of 70% or more in order to lower the contact resistance as well as satisfy high reflectivity conditions.

Further, the high reflectivity Ohmic contact layer may be preferably constituted of a first layer made of a material selected from the group consisting of Ni, Pd, Ir, Pt and Zn and a second layer of Ag or Al formed on the first layer. Alternatively, the high reflectivity Ohmic contact layer may have a first layer made of Ni, a second layer of Ag formed on the first layer and a third layer of Pt formed on the second layer.

Herein, it is preferred that the first layer has a thickness ranging from about 5 to 50 Å, the second layer has thickness ranging from about 1000 to 10000 Å, and the third layer has a thickness ranging from about 100 to 500 Å in order to improve the high reflectivity of the Ohmic contact layer having a two or three layered structure.

The high reflectivity Ohmic contact layer is formed via conventional vapor deposition or sputtering, in particular, at a temperature ranging from about 400 to 900° C. in order to improve the properties of the Ohmic contact layer.

P-Bonding Electrode and N-Electrode

The bonding electrode constitutes a component of the p-electrode structure together with the high reflectivity Ohmic contact layer and the metal barrier layer. The bonding electrode functions as the outermost electrode layer to be mounted on a lead pattern via conductive bumps in a flip chip structure, and is made of Au or an alloy containing Au.

Further, the n-electrode formed on the n-doped nitride semiconductor layer may be formed of a single or multiple layer structure that is made of a material selected from the group consisting of Ti, Cr, Al, Cu and Au.

Such electrodes may be formed via a typical method for growing metal layers such as vapor deposition and sputtering.

Metal Barrier Layer

The metal barrier layer of the invention, which is formed on a high reflectivity Ohmic contact layer area in which the p-bonding electrode is to be formed, serves as a layer for mixing in the interface between a bonding electrode material and an Ohmic contact material to prevent any property deterioration of the Ohmic contact layer (such as reflectivity and contact resistance). The metal barrier layer of this type may be constituted of a single or multiple layer structure that is made of a material selected from the group consisting of Ni, Al, Cu, Cr, Ti and combinations thereof.

Alternatively, the metal barrier layer may be extended to the sides of the high reflectivity Ohmic contact layer according to an alternative embodiment. In particular, the alternative embodiment has an advantage in that the metal barrier layer can effectively prevent the current leakage that is originated from the migration of Ag if any contained in the high reflectivity Ohmic contact layer.

In addition, the metal barrier layer of a predetermined reflectivity may be formed also in contact with the p-doped nitride semiconductor layer in the open areas of the high reflectivity Ohmic contact layer of a mesh structure in order to assist the reflection of the high reflectivity Ohmic contact layer.

The metal barrier layer is formed via conventional vapor deposition or sputtering as other electrodes, and preferably, heat treated at a temperature of about 300° C. for tens of seconds to several minutes in order to improve bonding ability.

Dielectric Barrier Layer

The dielectric barrier layer adoptable in the invention may be selectively formed on the high reflectivity Ohmic contact layer to expose at least the p-bonding electrode.

Preferably, the dielectric barrier layer may be formed to the extent of surrounding the sides of the high reflectivity Ohmic contact layer in order to serve as a typical passivation layer while preventing the current leakage that is originated from the migration of Al in the high Ohmic contact layer. According to an alternative embodiment, the dielectric barrier layer may be formed on one side of the LED, likewise to a conventional passivation structure, in order to expose the p-bonding electrode and the n-electrode.

The dielectric barrier layer may be formed of oxide or nitride containing an element selected from the group consisting of Si, Zr, Ta, Ti, In, Sn, Mg and Al.

Preferably, the dielectric barrier layer may be constituted of a high reflectivity layer having two types of dielectric layers of different refractivity, alternating with each other. The high reflectivity dielectric barrier layer in the flip chip LED may be formed according to a fabrication method for dielectric mirror layers disclosed in Korean Patent Application Serial No. 2003-41172 by Samsung Electro-Mechanics Co. (Jun. 24, 2003).

Hereinafter embodiments of the invention will be described in more detail with reference to the accompanying drawings.

Figure 2A:
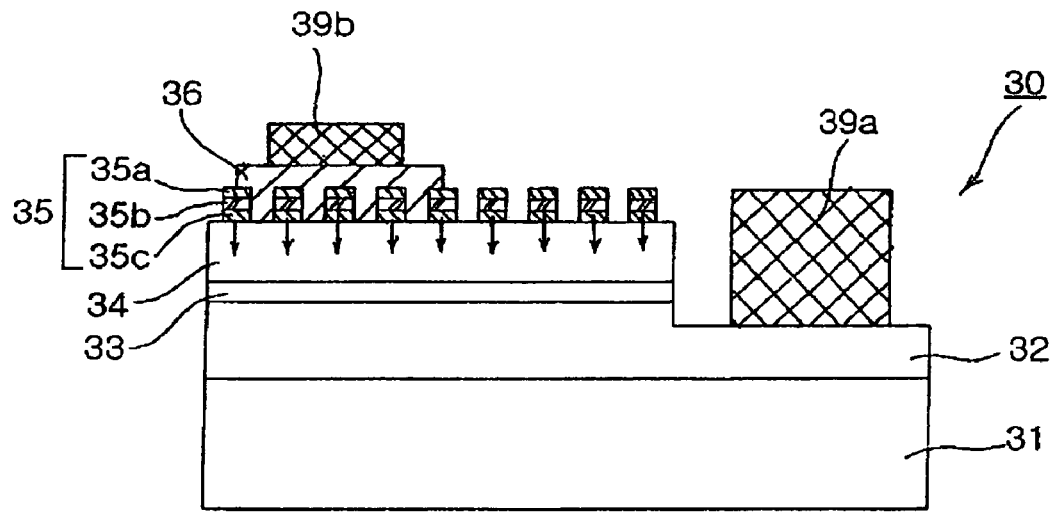
FIG. 2A is a side sectional view illustrating a flip chip nitride semiconductor LED according to a first embodiment of the invention.
Figure 2B:
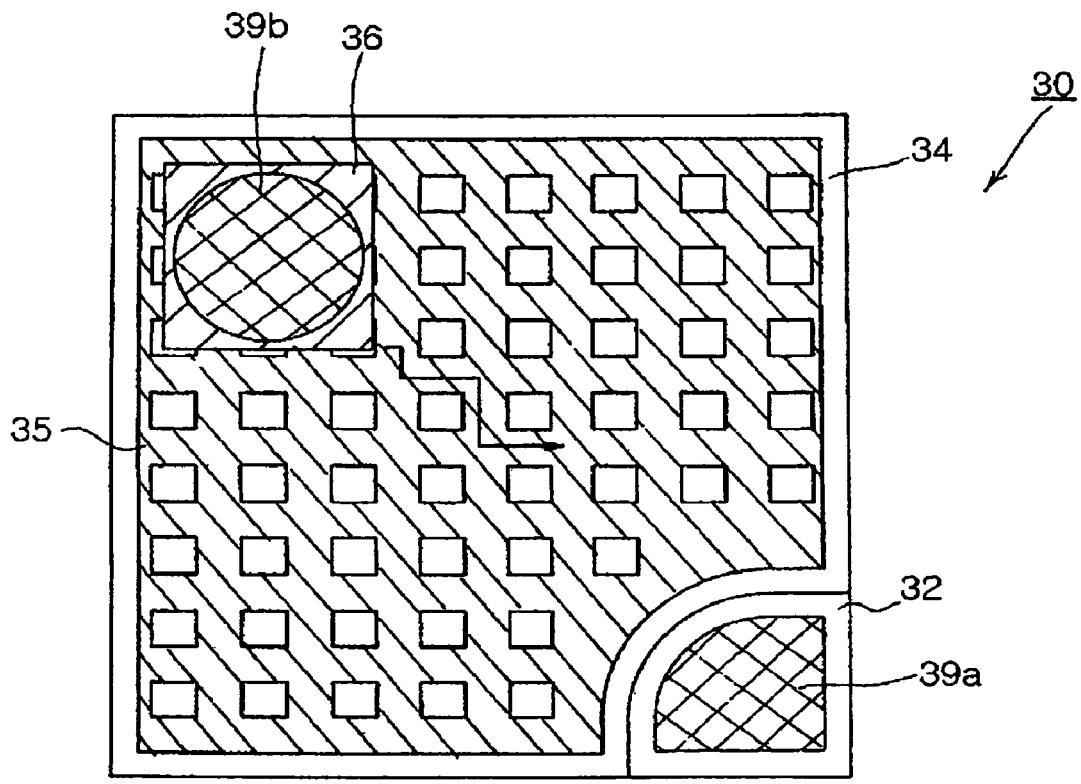
FIG. 2B is a plan view of FIG. 2A.

FIG. 2A is a side sectional view illustrating a flip chip nitride semiconductor LED 30 according to a first embodiment of the invention, and FIG. 2B is a plan view of FIG. 2A.

Referring to FIG. 2A first, the flip chip nitride semiconductor LED 30 includes a substrate 31 of for example sapphire for growing nitride semiconductors thereon and an n-doped nitride semiconductor layer 32, an active layer 33 and a p-doped nitride semiconductor layer 34 formed in their order on the substrate 31.

The nitride semiconductor LED 30 has an n-electrode 39a provided on a top region of the n-doped nitride semiconductor layer 32 which is exposed via mesa etching. A p-electrode structure of the nitride semiconductor LED 30 includes a high reflectivity Ohmic contact layer 35, a metal barrier layer 36 and a bonding layer 39b. The high reflectivity Ohmic contact layer 35 is formed on the p-doped nitride semiconductor layer 34, and has a mesh structure having a number of open areas to partially expose the p-doped nitride semiconductor layer 34. Further, the metal barrier layer 36 is formed on a predetermined top region of the high reflectivity Ohmic contact layer 35 on which the bonding electrode 39b is to be formed.

The high reflectivity Ohmic contact layer 35 preferably has a reflectivity of 70% or more, and forms an Ohmic contact with the p-doped nitride semiconductor layer. The high reflectivity Ohmic contact layer may have at least one layer (three layers 35a, 35b, 35c are included in the embodiment of FIG. 2A, made of a material selected from the group consisting of Ag, Ni, Al, Ph, Pd, Ir, Ru, Mg, Zn, Pt, Au and combination thereof. Preferably, the high reflectivity Ohmic contact layer 35 may be made of one of Ni/Ag, Zn/Ag, Ni/Al, Zn/Al, Pd/Ag, Pd/Al, Ir/Ag, Ir/Au, Pt/Ag, Pt/Al and Ni/Ag/Pt.

Referring to FIG. 2B together with FIG. 2A, a person of ordinary skill may understand the principle that current crowding is alleviated by the high reflectivity Ohmic contact layer 35 of a mesh structure according to the invention. That is, owing to the characteristics of the mesh structure as shown in FIG. 2B, current flows through the high reflectivity Ohmic contact layer 35, which has a specific resistance lower than that of the p-doped nitride semiconductor layer 34, along a long path (for example indicated with an arrow in FIG. 2B) until it reaches the n-electrode 39a. Therefore, the ratio of current directly flowing toward the p-doped nitride semiconductor layer 34 as shown in FIG. 2A can be relatively increased. As a result, this alleviates current crowding and at the same time allows more uniform light to be emitted from the entire active layer 33 thereby to remarkably increase the luminous efficiency while improving the reliability of the LED.

Although the high reflectivity Ohmic contact layer having the mesh structure of the invention can sufficiently alleviate current crowding as it is, the total open areas can correspond to preferably 70% or less, and more preferably, 50% or less of the entire top area of the Ohmic contact layer 35 in order to obtain a sufficient reflection area and improve current injection efficiency.

Figure 3A:
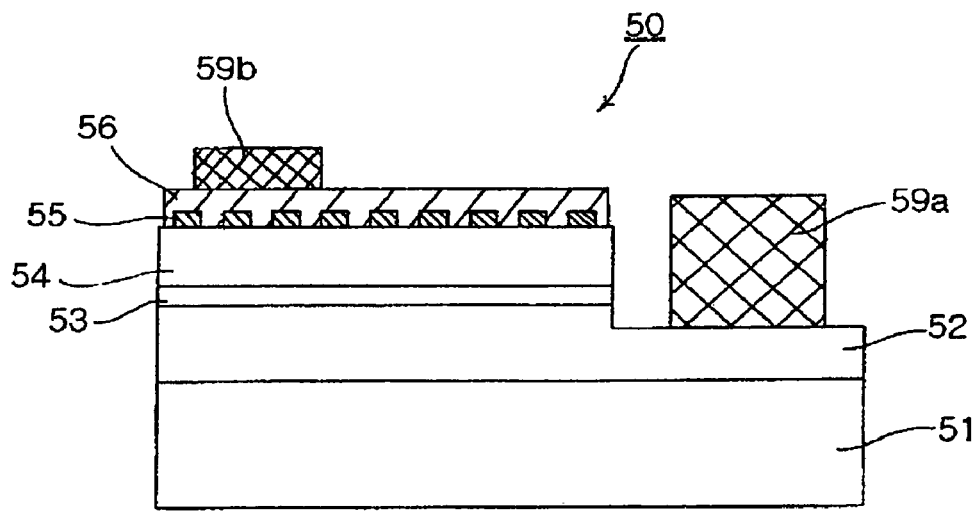
FIG. 3A is a side sectional view illustrating a flip chip nitride semiconductor LED according to a second embodiment of the invention.

FIG. 3A is a side sectional view illustrating a flip chip nitride semiconductor LED 50 according to a second embodiment of the invention.

As shown in FIG. 3A, the flip chip nitride semiconductor LED 50 includes a substrate 51 of for example sapphire for growing nitride semiconductors thereon and an n-doped nitride semiconductor layer 52, an active layer 53 and a p-doped nitride semiconductor layer 54 formed in their order on the substrate 51.

The nitride semiconductor LED 50 also has an n-electrode 59a and p-electrode structure. The n-electrode 59a is provided on a top region of the n-doped nitride semiconductor layer 52 exposed via mesa etching. The p-electrode structure includes a high reflectivity Ohmic contact layer 55, a metal barrier layer 56 and a bonding electrode 59b similar to the p-electrode structure shown in FIG. 2A, in which the metal barrier layer 56 is so configured to surround or cover not only the high reflectivity Ohmic contact layer 55 but also the sides thereof. While the metal barrier layer 36 in FIG. 2A is merely expectable to function as a barrier for preventing Au components from mixing in the interface between the p-bonding electrode 39b and the high reflectivity Ohmic contact layer 35, the metal barrier layer 56 of this embodiment can be expected to prevent the current leakage that is originated from the migration of elements in the high reflectivity Ohmic contact layer 55. In particular, this embodiment can be advantageously applied in case that the high reflectivity Ohmic contact layer 55 contains a high mobility element such as Ag.

Figure 3B:
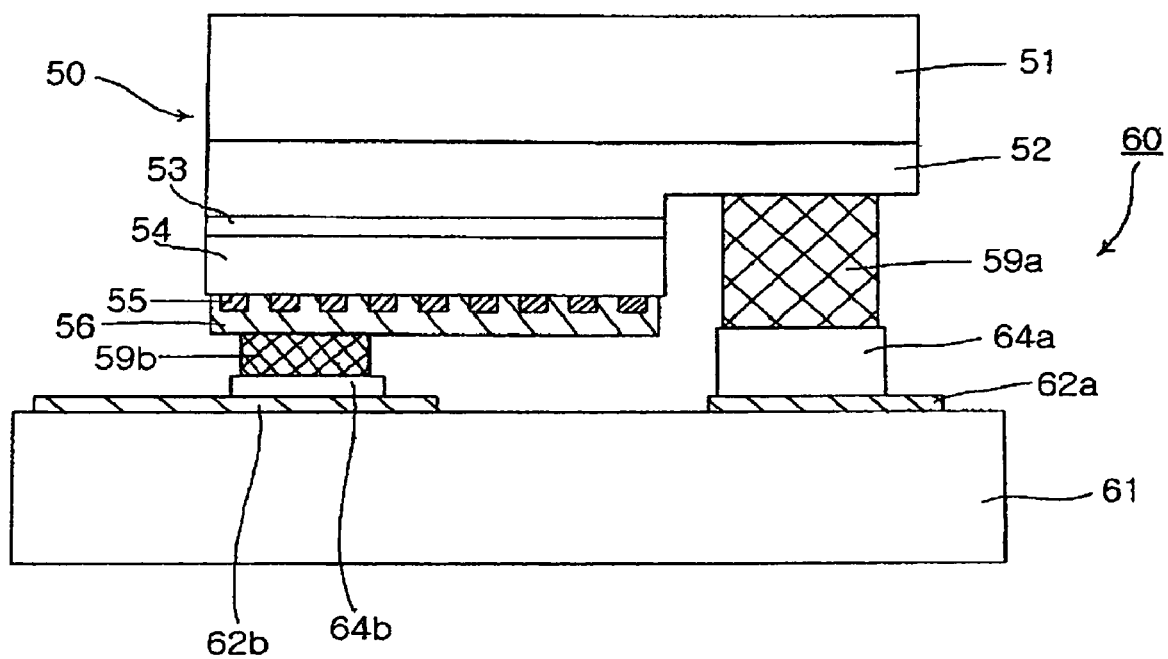
FIG. 3B is a side sectional view illustrating a chip structure having the flip chip nitride semiconductor LED in FIG. 3A mounted thereon.

FIG. 3B is a side sectional view illustrating a chip structure or flip chip light emitting device 60 having the flip chip nitride semiconductor LED 50 in FIG. 3A mounted thereon.

As shown in FIG. 3B, the nitride semiconductor LED 50 can be mounted on a supporting substrate 61 by welding electrodes 59a and 59b with lead patterns 62a and 62b via conductive bumps 64a and 64b. As described hereinbefore, the sapphire substrate 51 of the LED 50 in the flip chip light emitting device 60 is used as a light emitting plane since it is transparent. The high reflectivity Ohmic contact layer 55 can lower the contact resistance between itself and the p-doped nitride semiconductor layer 54, and owing to the high reflectivity, increase light quantity directed toward the light emitting plane. Further, since the metal barrier layer 56 of the LED 50 having a specific reflectivity is so formed to cover open areas of the high reflectivity Ohmic contact layer 55, it can improve the total reflection ability thereby to realize higher luminance.

Figure 4A:
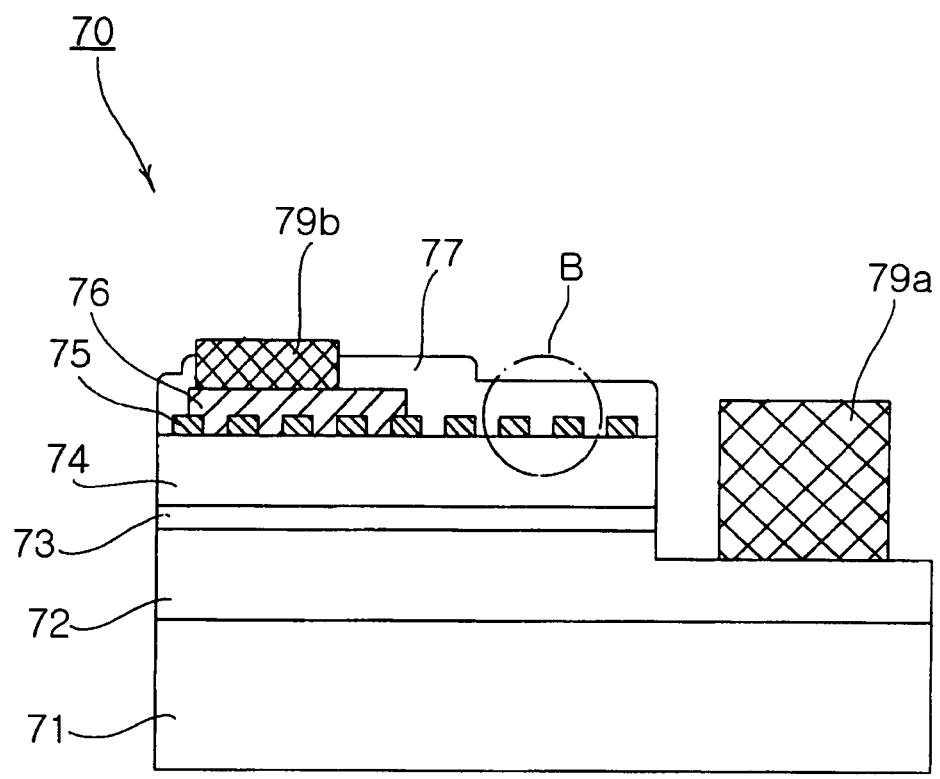
FIG. 4A is a side sectional view illustrating a flip chip nitride semiconductor LED according to a third embodiment of the invention.

FIG. 4A is a side sectional view illustrating a flip chip nitride semiconductor LED 70 according to a third embodiment of the invention.

As shown in FIG. 4A, the flip chip nitride semiconductor LED 70 includes a sapphire substrate 71 and an n-doped nitride semiconductor layer 72, an active layer 73 and a p-doped nitride semiconductor layer 74 formed in their order on the sapphire substrate 71. The nitride semiconductor LED 70 also includes an n-electrode 79a formed on a top region of the n-doped nitride semiconductor layer 72, which is exposed via mesa etching, and a p-electrode structure having a high reflectivity Ohmic contact layer 75, a metal barrier layer 76 and a bonding electrode 79b.

In this embodiment, a metal barrier layer 76 is provided to function as a barrier for preventing Au components from mixing in the interface between the p-bonding electrode 79b and the high reflectivity Ohmic contact layer 75. A dielectric barrier layer 77 is also provided to prevent the current leakage originated from the migration of high mobility elements such as Ag in the high reflectivity Ohmic contact layer 75. Alternatively, the dielectric barrier layer 77 may be extended to the sides of the LED 70 to expose the p-bonding electrode 79b and the n-electrode 79a as a conventional passivation layer. The dielectric barrier layer 77 may be made of oxide or nitride containing an element selected from the group consisting of Si, Zr, Ta, Ti, In, Sn, Mg and Al.

The dielectric barrier layer 77 of the invention may be formed into a dielectric mirror structure of high reflectivity to remarkably improve the entire reflection ability of the LED. That is, the dielectric barrier layer 77 of the invention is constituted of two types of dielectric layers of (77a, 77b in FIG. 4B) different refractivity, repeatedly alternating with each other.

Figure 4B:
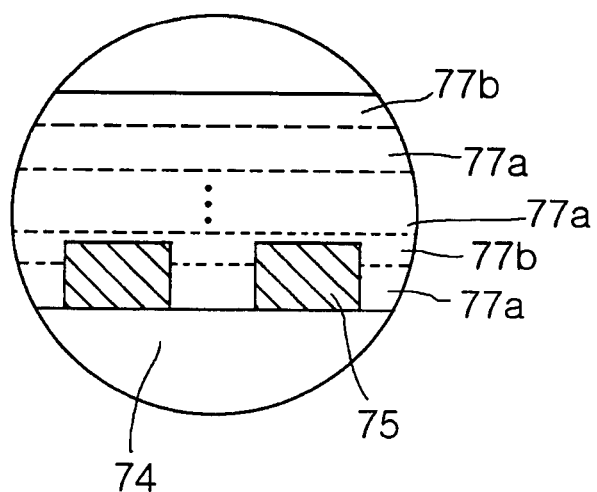
FIG. 4B is an enlargement of a part B of a dielectric barrier layer shown in FIG. 4A.

FIG. 4B is an enlargement of a part B of the dielectric barrier layer 77 in FIG. 4A. As shown in FIG. 4B, the dielectric barrier layer can have a structure obtained by repeatedly alternating $SiO_2$ films and $Si_3N_4$ films of different refractivity with each other. Such a method for forming the high reflectivity dielectric barrier layer into a dielectric mirror structure may be adopted from a fabrication method for dielectric mirror layers disclosed in Korean Patent Application Serial No. 2003-41172 by Samsung Electro-Mechanics Co. (Jun. 24, 2003). According to this document, a high reflectivity layer can be obtained with a reflectivity of 90% or more, and more preferably, 97% or more. With the dielectric barrier layer obtained by repeatedly alternating the dielectric layers of different refractivity with each other as described hereinbefore, the invention can remarkably improve the reflection ability of the entire LED and thus increase the effective luminous efficiency of the flip chip nitride semiconductor LED up to a very high level.

EXAMPLES

Experiments were carried out as follows in order to compare properties of flip chip nitride semiconductor LEDs according to Inventive Examples with those of a conventional flip chip nitride semiconductor LED according to a Comparative Example.

Inventive Example 1

First, after loading a sapphire substrate into a MOCVD chamber, a GaN low temperature nucleation layer was grown as a buffer layer. Then, an n-doped semiconductor layer of an n-doped GaN film and an n-doped AlGaN layer, an active layer having a multiple quantum well structure of InGaN/GaN films and a p-doped nitride semiconductor layer of a p-doped GaN film were formed on the buffer layer to obtain a blue LED.

Next, a high reflectivity Ohmic contact layer of a mesh structure having an open area ratio of about 30% was formed on the p-doped nitride semiconductor layer, and then a resultant structure was heat treated at a temperature of about 500° C. The high reflectivity Ohmic contact layer of the Inventive Example 1 was made from Ni/Ag. Herein the open area ratio means the ratio of open areas with respect to the entire area (i.e., the area surround by the outermost periphery) as generally used in the specification.

Then, a metal barrier layer on the p-doped nitride semiconductor layer was formed to surround the top and sides of the high reflectivity Ohmic contact layers (refer to FIG. 3A), and a resultant structure was heat treated at a temperature of about 350° C. Next, a p-bonding electrode and an n-electrode containing Au in common were formed to complete a flip chip nitride semiconductor LED.

The flip chip nitride semiconductor LED prepared in the Inventive Example 1 was coupled with a supporting substrate provided with a lead pattern as shown in FIG. 3B to produce a flip chip light emitting device.

Inventive Example 2

In the Inventive Example 2, a flip chip nitride semiconductor LED was prepared according to the same conditions as in the Inventive Example 1 except that a high reflectivity Ohmic contact layer of a mesh structure was patterned to have an open area ratio of about 50%. The flip chip nitride semiconductor LED prepared like this was coupled with a supporting substrate provided with a lead pattern as shown in FIG. 3B to produce a flip chip light emitting device.

Inventive Example 3

In the Inventive Example 3, a flip chip nitride semiconductor LED was prepared according to the same conditions as in the Inventive Example 1 except that a high reflectivity Ohmic contact layer of a mesh structure was patterned to have an open area ratio of about 70%. The flip chip nitride semiconductor LED prepared like this was coupled with a supporting substrate provided with a lead pattern as shown in FIG. 3B to produce a flip chip light emitting device.

Comparative Example

In this Comparative Example, a flip chip nitride semiconductor LED was prepared according to the same conditions as the above Inventive Examples 1 to 3 except that a high reflectivity Ohmic contact layer was formed into a conventional configuration (or unmeshed configuration) of the same entire area without any separate patterning process for forming a mesh structure. The flip chip nitride semiconductor LED prepared like this was coupled with a supporting substrate provided with a lead pattern as shown in FIG. 3B to produce a flip chip light emitting device.

Figure 5A:
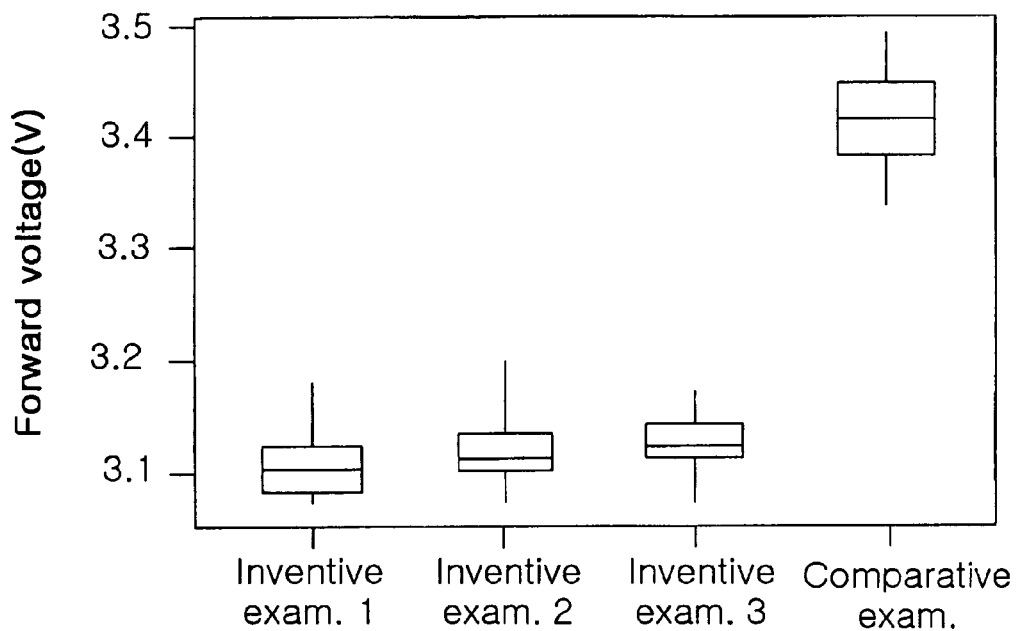
FIGS. 5A and 5B are graphs comparing forward and output voltage characteristics of flip chip light emitting devices incorporating nitride semiconductor LEDs of the invention, respectively, with those of a conventional flip chip light emitting device.
Figure 5B:
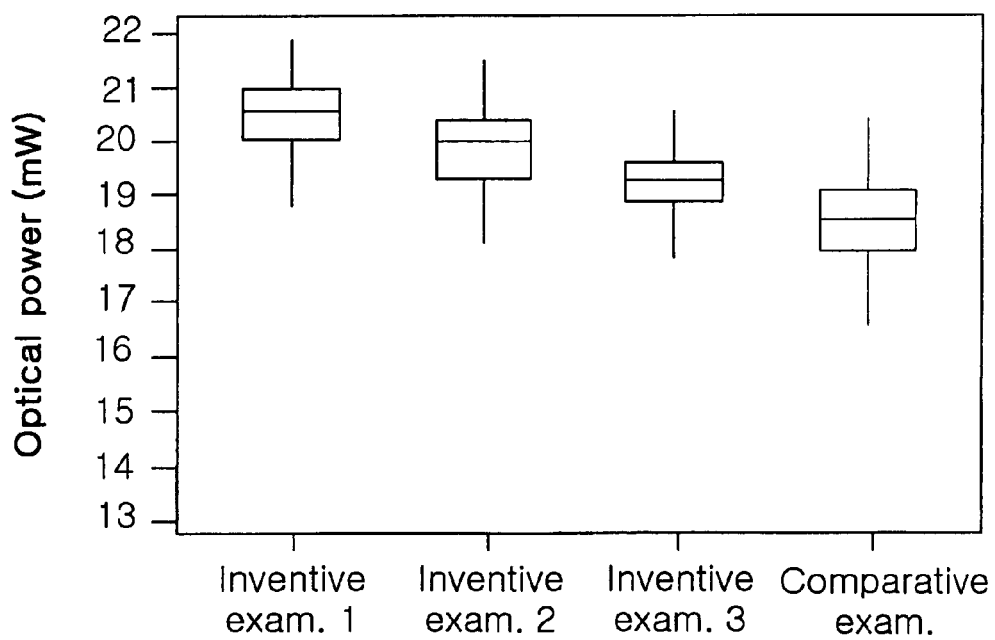

The flip chip light emitting devices produced according to the Inventive Examples 1 to 3 and the Comparative Example as above were measured of forward voltage characteristics and electric power characteristics. FIGS. 5A and 5B are graphs comparing the forward and output voltage characteristics of the flip chip light emitting devices according to the Inventive Examples 1 to 3 and the Comparative Example.

Referring to FIG. 5A, the flip chip light emitting device of the Comparative Example showed a forward voltage of about 3.42V, whereas the flip chip light emitting devices according to the Inventive Examples 1 to 3 showed forward voltages of about 3.10V, 3.11V and 3.12V, respectively. This indicates that the Inventive Examples 1 to 3 had average voltage reduction of about 0.3V and thus forward voltage characteristics improvement of about 10%. Further, the Inventive Example 1 (in which the open area ratio was 30%) showed the lowest forward voltage of 3.10V.

Referring to FIG. 5B, the flip chip light emitting device of the Comparative Example showed an electric power of about 18.53 mW, whereas the flip chip light emitting devices according to the Inventive Examples 1 to 3 showed electric powers of about 20.59 mW, 19.99 mW and 19.24 mW, respectively. In particular, the Inventive Example 1 (in which the open area ratio was 30%) obtained power enhancement of about 2 mW and thus efficiency improvement of 10% or more over the Comparative Example.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

As described hereinbefore, the nitride semiconductor LED of the present invention adopts the high reflectivity Ohmic contact layer of a mesh structure in the p-electrode structure to decrease current concentrated on a region of the LED adjacent to the n-electrode as well as increase current flowing toward the p-doped nitride semiconductor layer thereby reducing current crowding. As a consequence, the flip chip nitride semiconductor LED of the invention can have lower forward voltage and higher luminous efficiency while effectively preventing deterioration thereby to remarkably improve reliability.

What is claimed is:

1. A nitride semiconductor light emitting diodes, comprising:
    a transparent substrate for single crystal growth of a nitride semiconductor material;
    an n-doped nitride semiconductor layer formed on the transparent substrate;
    an active layer formed on the n-doped nitride semiconductor layer;
    a p-doped nitride semiconductor layer formed on the active layer;
    a high reflectivity Ohmic contact layer of a mesh structure formed on the p-doped nitride semiconductor layer and having a number of open areas for exposing the p-doped nitride semiconductor layer, wherein the high reflectivity Ohmic contact layer comprises at least one layer made of a material selected from the group consisting of Ag, Rh, Pd, Ir, Pt, Au and combinations thereof;
    a metal barrier layer formed on at least a top region of the high reflectivity Ohmic contact layer, wherein the metal barrier layer comprises at least one layer made of a material selected from the group consisting of Ni, Cu, Cr, Ti and combinations thereof;
    a p-bonding electrode formed on the metal barrier layer; and
    an n-electrode formed on the n-doped nitride semiconductor layer.

2. The nitride semiconductor light emitting diode according to claim 1, wherein the open areas of the high reflectivity Ohmic contact layer total up to 50% or less of the entire top area of the Ohmic contact layer.

3. The nitride semiconductor light emitting diode according to claim 1, wherein the high reflectivity Ohmic contact layer comprises a first layer made of a material selected from the group consisting of Rh, Pd, Ir, Pt and Au, and a second layer of Ag formed on the first layer.

4. The nitride semiconductor light emitting diode according to claim 1, wherein the high reflectivity Ohmic contact layer comprises a first layer made of Rh, Pd, Ir, and Au, a second layer of Ag formed on the first layer, and a third layer of Pt formed on the second layer.

5. The nitride semiconductor light emitting diode according to claim 4, wherein the first layer has a thickness ranging from about 5 to 50 Å, the second layer has a thickness ranging from about 1000 to 10000 Å, and the third layer has a thickness ranging from about 100 to 500 Å.

6. The nitride semiconductor light emitting diode according to claim 1, wherein the metal barrier layer is formed to surround the entire high Ohmic contact layer.

7. The nitride semiconductor light emitting diode according to claim 1, wherein the metal barrier layer is formed to be connected with top regions of the p-doped nitride semiconductor layer exposed by the open areas of the high reflectivity Ohmic contact layer.

8. The nitride semiconductor light emitting diode according to claim 1, further comprising a dielectric barrier layer formed on the high reflectivity Ohmic contact layer to expose at least the p-bonding electrode.

9. The nitride semiconductor light emitting diode according to claim 8, wherein the dielectric barrier layer is formed to surround the high reflectivity Ohmic contact layer.

10. The nitride semiconductor light emitting diode according to claim 8, wherein the dielectric barrier layer is formed on one side of the light emitting diode to expose the p-bonding electrode and the n-electrode.

11. The nitride semiconductor light emitting diode according to claim 8, wherein the dielectric barrier layer comprises a reflection layer having two types of dielectric layers of different refractivity, the two types of dielectric layers repeatedly alternating with each other.

12. The nitride semiconductor light emitting diode according to claim 8, wherein the dielectric barrier layer is made of oxide or nitride that contains an element selected from a group including Si, Zr, Ta, Ti, In, Sn, Mg and Al.

13. The nitride semiconductor light emitting diode according to claim 1, wherein
the high reflectivity Ohmic contact layer comprises at least one layer made of a material selected from the group consisting of Pd, Ir, Pt, and Au and combinations thereof; and
the metal barrier layer comprises at least one layer made of a material selected from the group consisting of Ni and Ti and combinations thereof.

14. A nitride semiconductor light emitting diode, comprising:
a transparent substrate for single crystal growth of a nitride semiconductor material;
an n-doped nitride semiconductor layer formed on the transparent substrate;
an active layer formed on the n-doped nitride semiconductor layer,
a p-doped nitride semiconductor layer formed on the active layer;
a high reflectivity Ohmic contact layer of a mesh structure formed on the p-doped nitride semiconductor layer and having a number of open areas for exposing the p-doped nitride semiconductor layer, wherein the high reflectivity Ohmic contact layer has a reflectivity of at least 70% to reflect light emitted from the active layer toward the transparent substrate;
a metal barrier layer formed on at least a top region of the high reflectivity Ohmic contact layer, wherein the metal barrier layer forms a barriers, which prevents diffusion of components of the high reflectivity Ohmic contact layer, and has a reflectivity to reflect light emitted from the active layer toward the transparent substrate;
a p-bonding electrode formed on the metal barrier layer; and
an n-electrode formed on the n-doped nitride semiconductor layer.

15. A nitride semiconductor light emitting diode, comprising;
a transparent substrate;
an n-doped nitride semiconductor layer formed on the transparent substrate;
an active layer formed on the n-doped nitride semiconductor layer;
a p-doped nitride semiconductor layer formed on the active layer;
a high reflectivity Ohmic contact layer formed on the p-doped nitride semiconductor layer and having a plurality of spaced openings exposing partially the p-doped nitride semiconductor layer;
a metal barrier layer formed on the high reflectivity Ohmic contact layer, wherein the metal barrier layer comprises at least one layer made of a material selected from the group consisting of Ni, Cu, Cr, Ti and combinations thereof
a p-bonding electrode formed on the metal barrier layer; and
an n-electrode formed on the n-doped nitride semiconductor layer.

16. The nitride semiconductor light emitting diode according to claim 15, wherein the high reflectivity Ohmic contact layer comprises
a first layer formed on top of the p-doped nitride semiconductor layer and made of a material selected from the group consisting of Pd, Ir, Pt and Au; and
a second layer of Ag formed on top of the first layer.

17. The nitride semiconductor light emitting diode according to claim 15, wherein the high reflectivity Ohmic contact layer comprises
a first layer formed on top of the p-doped nitride semiconductor layer and made of Pd, Ir, and Au;
a second layer of Ag formed on top of the first layer, and
a third layer of Pt formed on top of the second layer.

18. The nitride semiconductor light emitting diode according to claim 15, wherein
the high reflectivity Ohmic contact layer has a reflectivity of at least 70% to reflect light emitted from the active layer toward the transparent substrate; and
the metal barrier layer forms a barriers, which prevents diffusion of components of the high reflectivity Ohmic contact layer into the p-bonding electrode and is reflective to reflect light emitted from the active layer toward the transparent substrate.

19. The nitride semiconductor light emitting diode according to claim 15, wherein the metal barrier layer has portions that extend downward through the openings in the high reflectivity Ohmic contact layer to be connected with top regions of the p-doped nitride semiconductor layer exposed by the openings of the high reflectivity Ohmic contact layer.

20. The nitride semiconductor light emitting diode according to claim 19, wherein
the high reflectivity Ohmic contact layer comprises at least one layer made of a material selected from the group consisting of Pd, Ir, Pt, and combinations thereof, and
the metal barrier layer comprises at least one layer made of a material selected from the group consisting of Ni and Ti and combinations thereof.

* * * * *